US010890974B2

(12) United States Patent
Ma et al.

(10) Patent No.: US 10,890,974 B2
(45) Date of Patent: Jan. 12, 2021

(54) ELECTROMAGNETICALLY ACTUATING A HAPTIC FEEDBACK SYSTEM

(71) Applicant: Microsoft Technology Licensing, LLC, Redmond, WA (US)

(72) Inventors: Siyuan Ma, Bothell, WA (US); James David Holbery, Bellevue, WA (US); Kelly Marie Bogan, Redmond, WA (US); Sang Ho Yoon, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/183,639

(22) Filed: Nov. 7, 2018

(65) Prior Publication Data

US 2020/0142485 A1 May 7, 2020

(51) Int. Cl.
*D02G 3/12* (2006.01)
*D02G 3/36* (2006.01)
(Continued)

(52) U.S. Cl.
CPC ............... *G06F 3/016* (2013.01); *D02G 3/12* (2013.01); *D02G 3/36* (2013.01); *D02G 3/441* (2013.01);
(Continued)

(58) Field of Classification Search
CPC ...................................................... B63H 21/21
See application file for complete search history.

(56) References Cited

U.S. PATENT DOCUMENTS 4,510,939 A * 4/1985 Brenman ............. A61N 1/0452
600/384
6,424,333 B1 7/2002 Tremblay et al.
(Continued)

FOREIGN PATENT DOCUMENTS

DE 102008003122 A1 7/2009
EP 3021454 A1 5/2016
(Continued)

OTHER PUBLICATIONS

"New Textiles 2010", Retrieved from: <<http://courses.media.mit.edu/2010spring/mas962/2010/pmwiki.php%3Fn=S.BatessMagneticYarn.html>>, Mar. 11, 2010, 5 Pages.
(Continued)

*Primary Examiner* — Joseph H Feild
*Assistant Examiner* — Pameshanand Mahase
(74) *Attorney, Agent, or Firm* — Alleman Hall Creasman & Tuttle LLP

(57) ABSTRACT

Examples are disclosed that relate to haptic actuators. One disclosed example provides a haptic actuator including an inductive coil, a layer of a compressible material positioned adjacent to the inductive coil and transverse to an axis of the inductive coil, and a magnet positioned on the layer of compressible material such that the magnet is movable relative to the inductive coil via compression of the layer of the compressible material upon application of a control signal to the inductive coil. Another example provides an article including a textile formed at least partially from a yarn including a core and a conductor wound around the core to form an inductive coil, and a magnetic object integrated with the textile at a position transverse to a direction of a magnetic field formed by the inductive coil.

9 Claims, 9 Drawing Sheets

(51) Int. Cl.
    *H02K 35/02* (2006.01)
    *G08B 6/00* (2006.01)
    *H04M 19/04* (2006.01)
    *G06F 3/01* (2006.01)
    *D02G 3/44* (2006.01)

(52) U.S. Cl.
    CPC ......... *H02K 35/02* (2013.01); *D10B 2401/16* (2013.01); *G06F 3/011* (2013.01)

(56) References Cited

U.S. PATENT DOCUMENTS

| | | |
|---|---|---|
| 6,437,770 B1 | 8/2002 | Venema et al. |
| 6,982,696 B1 | 1/2006 | Shahoian |
| 7,362,889 B2 | 4/2008 | Dubowsky et al. |
| 7,919,945 B2 | 4/2011 | Houston et al. |
| 7,944,433 B2 | 5/2011 | Schena et al. |
| 8,072,418 B2 | 12/2011 | Crawford et al. |
| 8,138,865 B2 | 3/2012 | North et al. |
| 8,362,882 B2 | 1/2013 | Heubel et al. |
| 8,760,248 B2 | 6/2014 | Marie |
| 8,981,682 B2 | 3/2015 | Delson et al. |
| 9,104,271 B1 | 8/2015 | Adams et al. |
| 9,183,976 B2 | 11/2015 | Hanchett, Jr. et al. |
| 9,582,034 B2 | 2/2017 | von Badinski et al. |
| 9,678,577 B1 | 6/2017 | Rutledge et al. |
| 9,784,249 B2* | 10/2017 | Li .................... H02N 11/006 |
| 9,829,981 B1 | 11/2017 | Ji |
| 9,886,842 B2 | 2/2018 | Yousef et al. |
| 9,911,292 B1 | 3/2018 | Khoshkava et al. |
| 9,924,251 B2 | 3/2018 | Efrati |
| 9,962,082 B2 | 5/2018 | Kim et al. |
| 10,037,660 B2 | 7/2018 | Khoshkava et al. |
| 10,055,019 B2 | 8/2018 | Beran |
| 10,055,949 B2 | 8/2018 | Maalouf et al. |
| 2006/0142658 A1 | 6/2006 | Perkuhn et al. |
| 2011/0288604 A1* | 11/2011 | Kaib .................... A61N 1/046 607/5 |
| 2012/0080980 A1 | 4/2012 | Kaal et al. |
| 2012/0306798 A1 | 12/2012 | Zoller et al. |
| 2013/0135223 A1 | 5/2013 | Shai |
| 2015/0109223 A1 | 4/2015 | Kessler et al. |
| 2015/0205368 A1* | 7/2015 | Yairi .................... G06F 3/046 345/173 |
| 2016/0233012 A1 | 8/2016 | Lubinski et al. |
| 2017/0035550 A1 | 2/2017 | Hiraoka et al. |
| 2017/0092086 A1 | 3/2017 | Keller et al. |
| 2017/0180863 A1 | 6/2017 | Biggs |
| 2018/0052516 A1 | 2/2018 | Efrati |
| 2018/0076702 A1* | 3/2018 | Mori .................... H02K 33/18 |
| 2018/0151281 A1* | 5/2018 | Khoshkava ............ G08B 6/00 |
| 2018/0158290 A1 | 6/2018 | Khoshkava et al. |
| 2018/0163707 A1 | 6/2018 | Kaneko et al. |
| 2018/0166960 A1* | 6/2018 | Shim .................... H02K 33/02 |

FOREIGN PATENT DOCUMENTS

| | | |
|---|---|---|
| EP | 3002958 B1 | 12/2017 |
| EP | 3257591 A1 | 12/2017 |
| GB | 2373399 A | 9/2002 |
| JP | 2008081896 A | 4/2008 |
| KR | 20170089573 A | 8/2017 |
| WO | 2009037631 A1 | 3/2009 |
| WO | 2011096606 A1 | 8/2011 |
| WO | 2016154752 A1 | 10/2016 |
| WO | 2017171757 A1 | 10/2017 |
| WO | 2017171868 A1 | 10/2017 |
| WO | 2017194239 A1 | 11/2017 |

OTHER PUBLICATIONS

Barua, Avishek, "Dynamic Haptic Feedback in Comparing Spatial Information", In Masters thesis of University of Tampere, Jun. 2013, 59 Pages.

Bau, et al., "BubbleWrap: A Textile-based Electromagnetic Haptic Display", In Proceedings of Extended Abstracts on Human Factors in Computing Systems, Apr. 4, 2009, pp. 3607-3611.

Chinello, et al., "A Three Revolute-Revolute-Spherical Wearable Fingertip Cutaneous Device for Stiffness Rendering", In Journal of IEEE Transactions on Haptics, vol. 11, Issue 1, Jan. 2018, 12 Pages.

Ekman, Fredrik, "Development and Evaluation of Textile Actuators", In Masters Thesis of Linkoping University, Jun. 13, 2016, 45 Pages.

Fries, et al., "Electromagnetically Driven Soft Actuator", Retrieved from: <<http://shu21th.sakura.ne.jp/file/201412ROBIO_FedericoEtAl_Preprint.pdf>>, Dec. 5, 2014, 6 Pages.

Frydrysiak, et al., "Textile Magnetic Yarns—Research and Simulation", In Journal of Industria Textila, vol. 66, Issue 6, Dec. 2015, 8 Pages.

Lee, et al., "Design and Fabrication of a Novel Micro Electromagnetic Actuator", In Proceedings of Symposium on Design, Test, Integration and Packaging of MEMS/MOEMS, Apr. 9, 2008, 5 Pages.

Streque, et al., "New Magnetic Microactuator Design Based on PDMS Elastomer and MEMS Technologies for Tactile Display", In Journal of IEEE Transactions on Haptics, vol. 3, Issue 2, Apr. 2010, pp. 88-97.

Wang, et al., "Design Methodology for Magnetic Field-Based Soft Tri-Axis Tactile Sensors", In Journal of Sensors, vol. 16, Issue 9, Aug. 24, 2016, 20 Pages.

Weiss, Malte, et al., FingerFlux: Near-Surface Haptic Feedback on Tabletops, In Proceedings of the 24th Annual ACM Symposium on User Interface Software and Technology, Oct. 16, 2011, pp. 615-620.

Zhang, et al., "Magnetic Field Control for Haptic Display: System Design and Simulation", In Journal of IEEE Access, vol. 4, Jan. 5, 2016, pp. 299-311.

"International Search Report and Written Opinion Issued in PCT Application No. PCT/US2019/058988", dated May 8, 2020, 15 Pages.

* cited by examiner

ELECTROMAGNETICALLY ACTUATING A HAPTIC FEEDBACK SYSTEM

BACKGROUND

Virtual reality (VR) display systems immerse a user in an alternate reality, with virtual imagery occupying an entire field of view of an opaque display system. Augmented reality (AR) display systems, such as mixed reality (MR) display systems, display virtual objects mixed with real imagery, such as via a see-through display system. In either case, visual and auditory aspects of a virtual experience may be represented in a lifelike manner.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed that relate to haptic actuators. One disclosed example provides a haptic actuator comprising an inductive coil, a layer of a compressible material positioned adjacent to the inductive coil and transverse to an axis of the inductive coil, and a magnet positioned on the layer of compressible material such that the magnet is movable relative to the inductive coil via compression of the layer of the compressible material upon application of a control signal to the inductive coil.

Another example provides an article comprising a textile formed at least partially from a yarn including a core and a conductor wound around the core to form an inductive coil, and a magnetic object integrated with the textile at a position transverse to a direction of a magnetic field formed by the inductive coil.

DETAILED DESCRIPTION

While VR and AR display systems may represent visual and auditory aspects of a virtual experience in a lifelike manner, such devices may not have the ability to provide realistic tactile interactions with displayed virtual objects, such as when a body part intersects a displayed virtual object. As possible solutions, a wearable device of an VR or AR system may include a linear resonant actuator, eccentric rotating mass actuator, or voice coil actuator that is actuated in response to user interaction within a displayed virtual scene. Other examples of haptic actuators include piezoceramic materials, dielectric electroactive polymers, and ionic electroactive polymers. To create "soft" actuating experiences in which feedback output by such actuators resembles interactions with soft, deformable, and/or pliable objects, surfaces of the actuators may be coated with a soft interface material, or may utilize the mechanically flexible nature of a functional material within an actuator (e.g., an electroactive polymer).

However, the use of such haptic actuators may present various problems. For example, linear resonant actuators generally move at a fixed frequency. Thus, it may be difficult to simulate interactions with different types of virtual objects with such actuators. Eccentric rotating mass actuators generally exhibit a slow response, and may be subject to mechanical wearing that limits practicality for long-term usage. Voice coil actuators generally comprise a large physical form factor and may exhibit high power consumption, which may limit the use of such actuators on wearable devices with small batteries. Dielectric electroactive polymers may utilize too high of a control voltage for practical use on a wearable device. Ionic electroactive polymers may move slowly and require encapsulation to prevent liquid evaporation. Further, piezoceramic materials may be fragile.

Accordingly, examples are disclosed that relate to haptic actuating systems that may help to address such issues. Briefly, the disclosed examples provide electromagnetic actuators that may exhibit a wideband frequency response and may be configured to provide soft touch experiences. The disclosed examples also may exhibit low power consumption, may provide tunable output force and vibration modes based on an applied control signal, may provide skin conformability, and may be integrated with textiles and other flexible and/or pliable surfaces. The disclosed examples also may be used for various soft robotics applications, such as for controllably gripping objects via a soft interface.

Figure 1:
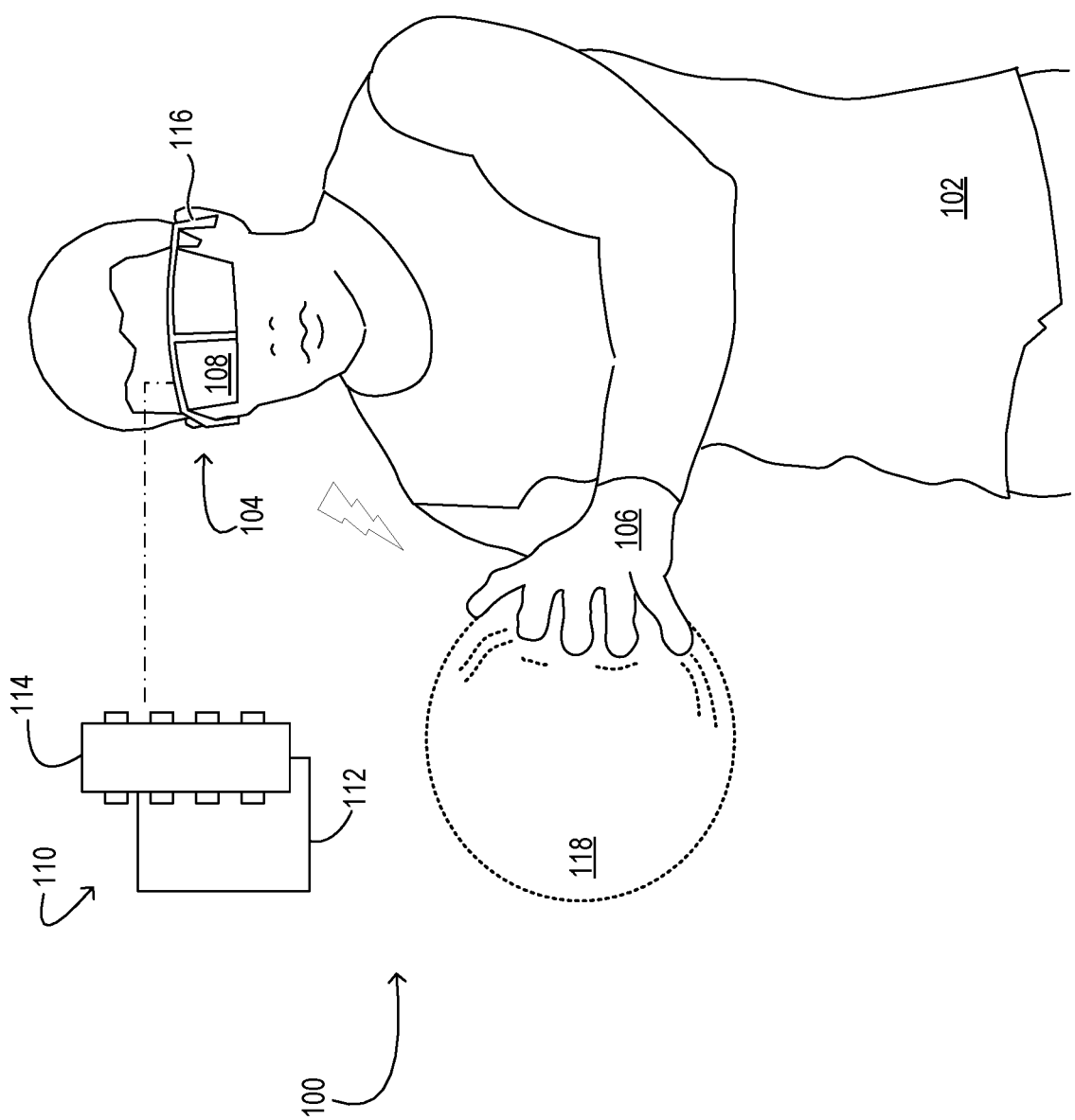
FIG. 1 shows an example scenario in which a haptic actuator is controlled to simulate tactile interactions with displayed virtual imagery.

FIG. 1 shows aspects of an example display system 100 configured to present an augmented or virtual reality environment to a user 102. The display system 100 as illustrated is used to support gameplay, but may be used in other scenarios as well. Display system 100 includes a head-mounted display (HMD) device 104 and a wearable electronic device 106 configured to provide haptic feedback.

HMD device 104 includes a near-eye display 108 configured to display virtual imagery in the user's field of view. In some examples, the near-eye display 108 is a see-through display, enabling real-world and virtual imagery to be admixed in the user's field of view. In other examples, the near-eye display 108 is opaque, providing a fully immersive virtual reality. In HMD device 104, signals encoding the virtual display imagery are sent to the display 108 via an on-board computing device 110. Computing device 110 includes at least one processor 112 and associated memory 114, examples of which are described below with reference to FIG. 8. HMD device 104 includes loudspeakers 116 that enable the user 102 to experience immersive audio.

Leveraging communications componentry arranged in the HMD device 104, the computing device 110 may be communicatively coupled to one or more off-board computing devices via a network. Thus, the virtual display imagery that the user 102 sees may, in some examples, be composed and/or rendered by an off-board computing device and sent wirelessly to the computing device 110. In other examples, the virtual display imagery may be composed and rendered on-board.

The electronic device 106 is configured to further augment the augmented, mixed, or virtual reality experience by providing a physical sensation to the user's skin responsive to user interaction with virtual imagery projected into a field of view of the user. In the example of FIG. 1, the physical sensation may be provided whenever the hand of the user 102 intersects virtual ball 118.

In some examples, the physical sensation provided by the electronic device 106 upon user interaction with a virtual display object may vary based on the virtual display object, such that the user is provided different tactile experiences for interactions with virtual objects of different surface texture, elasticity, deformability, etc. While the electronic device 106 takes the form of a glove in FIG. 1, an electronic device may take the form of a mouse, a handheld controller, a keyboard, upholstered furniture, a robot (e.g., soft robotics), or any other suitable article in other examples.

Figure 2:
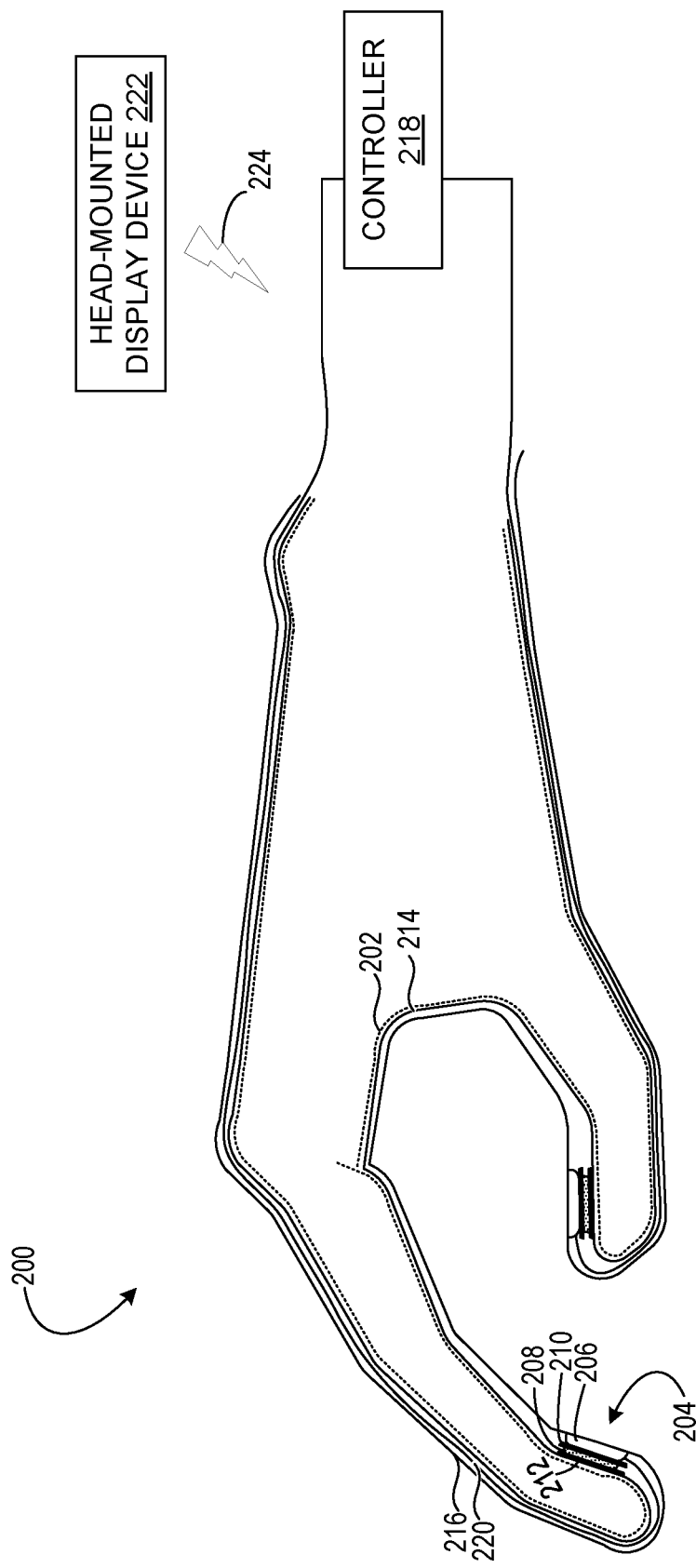
FIG. 2 schematically shows an example glove including a haptic actuator.

To simulate the sensation of interaction between the user's hand and a virtual display object, such as virtual ball 118, the electronic device 106 includes a haptic actuating system configured to modify a pressure sensation provided to the user in response to detecting initial contact and subsequent interaction with the virtual ball 118. FIG. 2 schematically shows aspects of an example electronic device 200 that takes the form of a glove worn on a hand 202 of a user. Glove 200 is an example of electronic device 106.

Glove 200 includes one or more electromagnetic haptic actuators 204 controllable to modify a pressure sensation experienced on a surface of the user's hand 202. Haptic actuator 204 comprises an inductive coil 206, a magnet 208, and a first compressible structure 210 positioned between the inductive coil and the magnet transverse to a central axis of the inductive coil. As described in more detail below, the haptic actuator may utilize a high current inductor such as those used in impedance matching circuits. Thus, in some examples, the actuator may be formed by simply adhering a compressible material to a cap or other suitable surface of the high current inductor, and then adhering a magnet on the compressible material. In the example of FIG. 2, the haptic actuator 204 also comprises a second compressible structure 212 disposed on an opposite side of the magnet 208 as the first compressible structure 210. The second compressible structure 212 may be closely coupled to the user's skin 202, for example, to provide a desired feel (e.g. soft, damped, etc.) for output provided by the haptic actuator 204. In other examples, the second compressible structure 212 may be omitted.

The haptic actuator 204 may be integrated with the electronic device 200 in any suitable manner. In the depicted example, the electronic device 200 comprises an inner skin-contacting layer 214 and an exterior layer 216, each of which may be formed from a layer of textile, a polymer sheet, or other suitable skin-conforming material(s). The haptic actuator 204 is positioned between the layers in such a position that the magnet is pushed toward a user's finger or moved horizontally, depending upon the magnetization direction of the magnet, when actuated. In other examples, the magnet 208 and the inductive coil 206 may be secured to opposing sides of a textile or polymer layer, such that the layer acts as the first compressible structure.

The electronic device 200 further comprises a controller 218 electrically connected each haptic actuator 204 via a wired connection 220. The controller 218 is configured to send control signals to the inductive coil 206 of each haptic actuator 204 to control a magnetic force between the magnet 208 and the inductive coil 206. In some examples, the control signal may be received from an external computing device (e.g. an HMD), or determined by the controller 218 based upon a signal received from an external computing device. The control signal may be configured to control a frequency, amplitude, and/or waveform of actuator motion to create a desired user sensation in response to an interaction with a virtual object. For example, metadata regarding material properties of virtual objects may be stored for each displayed virtual object, and the control signal sent to a haptic actuator may be determined based at least on such metadata. As a more specific example, an interaction with a displayed virtual object that represents a soft, deformable object (e.g. a balloon) may trigger the provision of a control signal that simulates progressively increasing pressure against a finger (e.g. by progressively increasing the force pushing the magnet from the inductive coil) as the finger progressively pushes farther into the virtual balloon.

Figure 3:
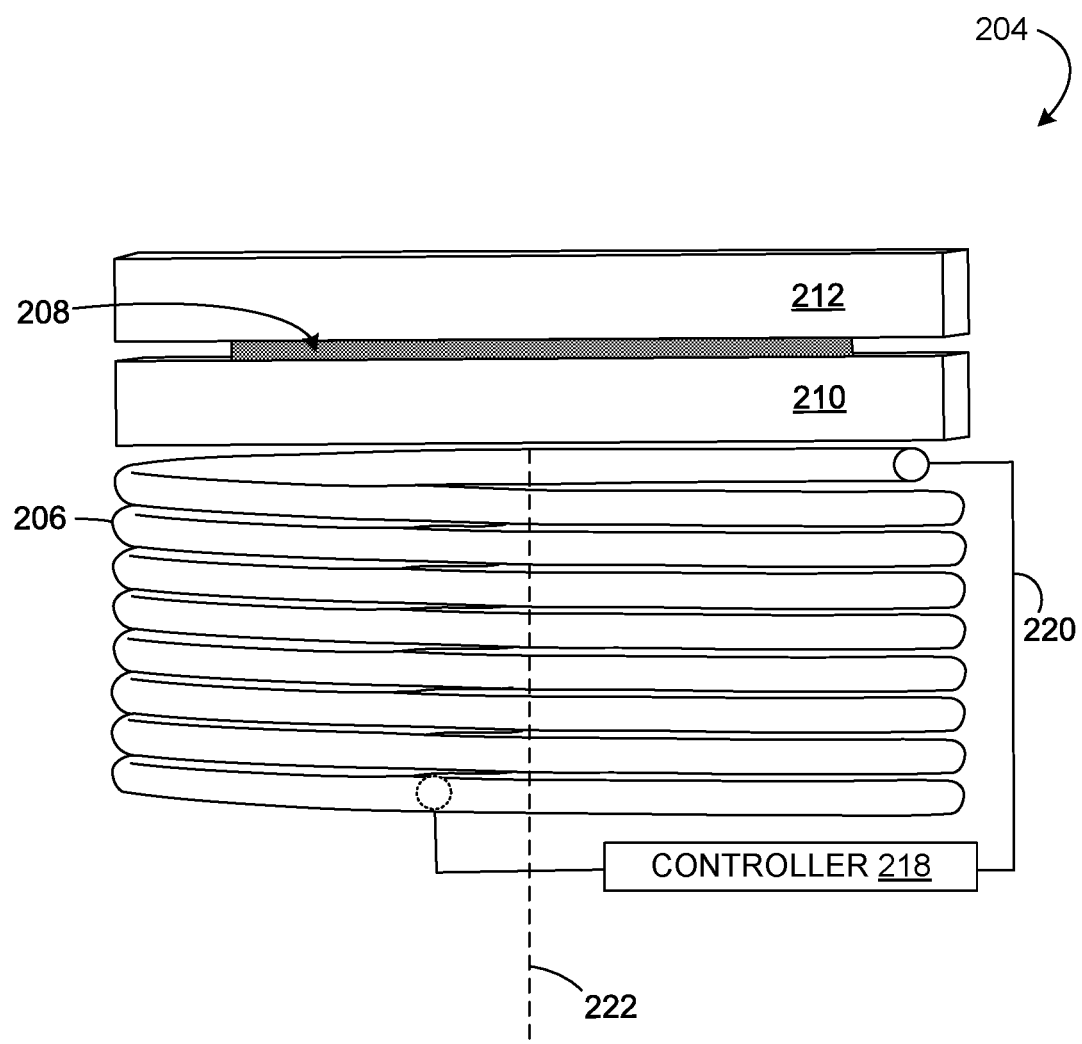
FIG. 3 shows an example haptic actuator.

FIG. 3 shows a schematic depiction of the electromagnetic haptic actuator 204. The controller 218 is configured to control a magnetic flux density of a magnetic field interacting with the magnet 208 by controlling an electric current applied to the inductive coil 206. The actuation properties of the electromagnetic haptic actuator 204 depend on various factors, including inductance of the inductive coil 206, control signal current, control signal frequency, magnetic strength of the magnet 208, and mechanical and geometric properties of the first compressible structure 210. The inductance of the inductive coil 206 may be modeled by equation (1), where L is inductance, μ is magnetic permeability of the inductive coil core material (not shown in FIG. 3), N is number of turns of the inductive coil, A is cross-sectional area of the inductive coil, and l is height of the inductive coil structure.

$$L = \frac{\mu N^2 A}{l} \quad (1)$$

In some examples, the inductive coil 206 comprises a surface-mountable configuration, such as a low-profile unshielded power inductor or surface-mount general purpose unshielded power inductor. In various examples, the inductive coil 206 may comprise an air core or a magnetic core (e.g. a ferrite core). Where a magnetic core is used, the core may comprise a cap extending beyond the coil, on which the first compressible structure 210 and the magnet 208 may be mounted.

Interaction between the inductive coil 206 and the magnet 208 also depends on various properties of the magnet 208, such as a magnetic material, shape, volume, magnetization strength, magnetization orientation, and/or magnetization direction of the magnet 208. The magnet 208 may comprise any suitable magnetic material, including ferromagnetic, diamagnetic, and paramagnetic materials. The magnet 208 may be axially magnetized or diametrically magnetized. While shown in FIG. 3 as a rectangular magnet smaller in volume than either of the first compressible structure 210 and the second compressible structure 212, the magnet 208 may comprise any suitable geometry.

When the magnet 208 comprises a ferromagnet, a force between the inductive coil 206 and the magnet 208 may be modeled according to equation (2), where F is the force between the inductive coil and the ferromagnet, L is the inductance of the coil, l is the height of the coil, I is the current within the inductive coil, N is the number of turns of the inductive coil, A is the cross-sectional area of the inductive coil, μ is the magnetic permeability of the inductive coil core material, and z is the distance between a top of the coil and the ferromagnet.

$$F = (NI)^2 \mu \frac{A}{2z^2} = L * l * I^2 * \frac{A}{2z^2} \quad (2)$$

When the magnet 208 comprises a permanent magnet, a force between the inductive coil 206 and the magnet 208 may be modeled according to equation (3), where F is the force between the inductive coil and the permanent magnet, l is the height of the coil, I is the current within the inductive coil, N is the number of turns of the inductive coil, R is the radius of the inductive coil, z is the distance between a center of the inductive coil and the permanent magnet, $M_m$ is the magnetization density, and $V_m$ is the volume of the permanent magnet.

$$F = M_m V_m \frac{\mu N I}{2l} \left( \frac{1}{\left(\left(z - \frac{l}{2}\right)^2 + R^2\right)^{\frac{3}{2}}} - \frac{1}{\left(\left(z + \frac{l}{2}\right)^2 + R^2\right)^{\frac{3}{2}}} \right) \quad (3)$$

Further, when the magnet 208 comprises a permanent magnet, a magnetization direction of a permanent magnet may be controlled during manufacturing for a desired vibrational output. As an example, after sintering neodymium or an alloy thereof, a strong inductive coil may magnetize the sintered neodymium into a desired magnetic pole alignment, such as a vertical north-south alignment in which north and south poles are stacked on top of one another, or a horizontal north-south alignment in which the north and south poles are aligned on left and right halves of the magnet rather than stacked on top of one another. In some examples, a vertical north-south magnetic pole alignment may cause substantially pure vertical vibration of the magnet 208 in the haptic actuator 204, whereas a horizontal north-south magnetic pole alignment may cause a pivoting or horizontal motion of the magnet 208 when actuated.

Figure 8B:
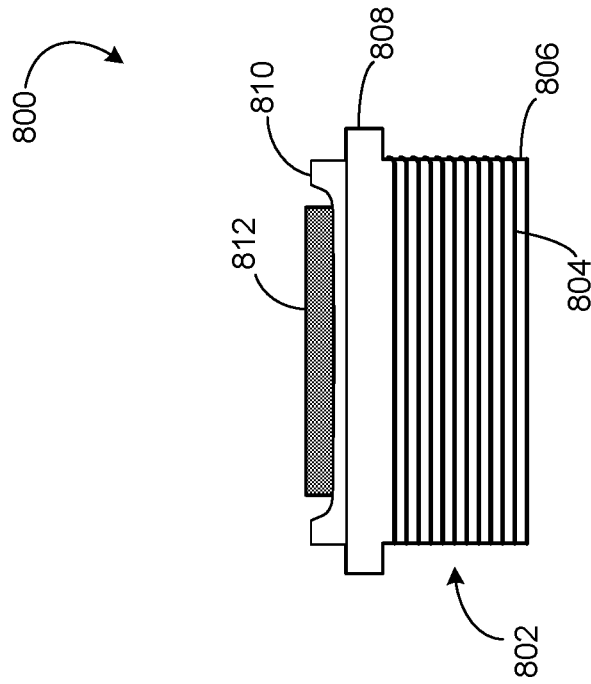
FIGS. 8A and 8B respectively show a compressible structure of an example electromagnetic actuator in an uncompressed state and compressed state.
Figure 8A:
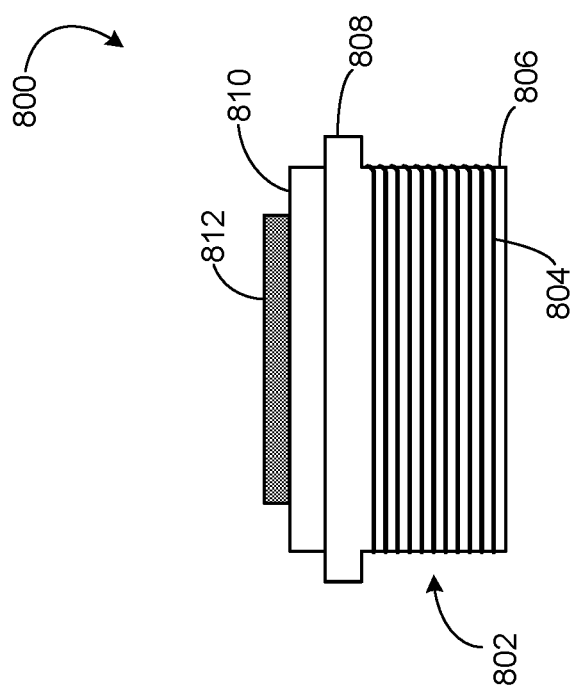

The first compressible structure 210 comprises a layer of a compressible material positioned adjacent to the inductive coil and transverse to a central axis 222 of the inductive coil 206. The first compressible structure 210 is configured to permit the magnet 208 to move relative to the inductive coil 206 via compression when the magnet is pulled toward the inductive coil 206 via a control signal, thereby compressing the first compressible structure between the magnet 208 and a surface of the inductive coil 206. This is illustrated in FIGS. 8A and 8B, which show an example implementation of the haptic actuator 204 in the form of an electromagnetic actuator 800 comprising a high current inductor 802 having a coil 804 and a core 806 with a cap 808 that extends beyond the coil 804. The electromagnetic actuator 800 also comprises a first compressible structure 810 connected to the cap 808, and a magnet 812 connected to the first compressible structure 810. In FIG. 8A, the compressible structure 810 is in an uncompressed state. In contrast, in FIG. 8B, the first compressible structure 810 is compressed between the magnet 812 and the cap 808 by application of a control signal to the coil 804. As shown, the control signal causes the first compressible structure 810 to be squeezed between these structures, thereby permitting motion of the magnet 812 by the compression of the first compressible structure 810.

Returning to FIG. 2, the haptic actuator 204 may be configured to simulate interactions with soft, deformable, and/or viscoelastic objects over a wide frequency range. Thus, the first compressible structure 210 may be formed from a material allowing appropriate responses to a change in a control signal. In some examples, the first compressible structure 210 comprises an open-cell or closed-cell foam material, such as a foamed olefin block copolymer. The first compressible structure 210 also may comprise an elastomeric material, such as a co-terminated butadiene rubber, or a silicone-based material. In further examples, the first compressible structure 210 may comprise a textile, such as a pile fabric, or a corrugated structure (e.g. formed from a resilient polymer or metal sheet). In any example, the use of a less elastic, less spring-like material may allow for a broader frequency response than a more elastic, more spring-like material (such as a stretchable elastic membrane supporting a magnet over a cavity within or above a coil, which may exhibit a relatively sharp resonance frequency band and thus narrower frequency response).

As mentioned above, each haptic actuator 204 optionally may comprise a second compressible structure 212 disposed on an opposite side of the magnet 208 as the first compressible structure 210. In the example of FIG. 2, the second compressible structure 212 comprises a second layer of a compressible material configured to be positioned against or close to the user's skin 202 (e.g. separated from the skin by a layer of fabric). In some examples, the second compressible structure 212 may be formed from a same material as the first compressible structure 210, while in other examples the second compressible structure may be formed from a different material than the first compressible structure 210. In some examples, the second compressible structure 212 may comprise a soft, deformable, and/or pliable material.

The composition and thickness of the first compressible structure 210 and/or the second compressible structure 212 may be selected to achieve desired mechanical properties, including press tolerance, actuating force, and mechanical compressibility. Press tolerance relates to a magnitude of a perceptible actuation response when an opposing force is applied (e.g. how greatly a tight grip on a controller comprising an actuator effects the perceptible actuator response). Press tolerance also relates to a distance to be maintained between the first compressible structure 210 and a surface of the inductive coil 206, as pressing the magnet too close to the inductive coil surface may result in the cessation of perceptible haptic response. Actuating force relates to a magnitude of force that translates from the haptic actuator 204 to a user contact point, and mechanical compressibility relates to a distance a surface of the material travels when pressed with a test force.

Figure 4B:
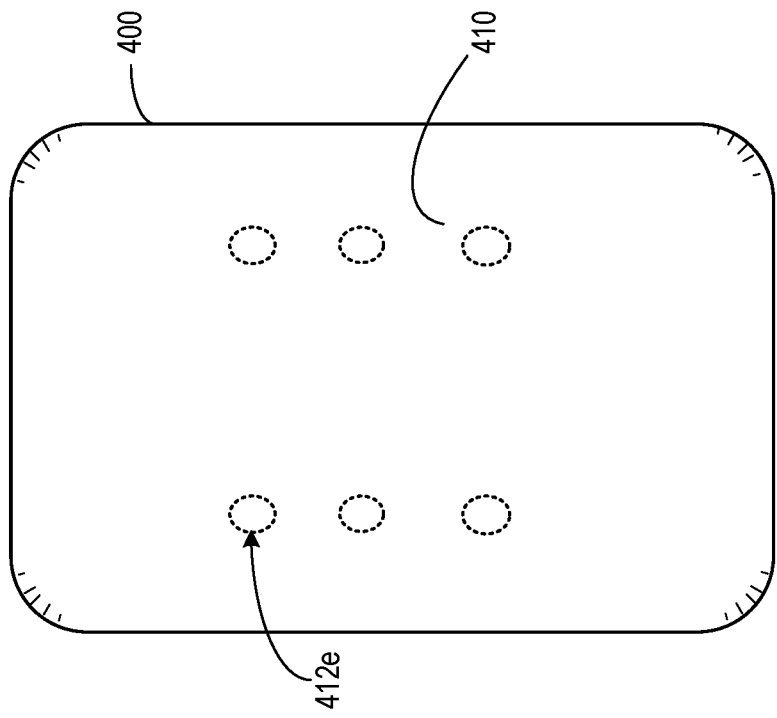
FIGS. 4A-4B depict an example mobile device case comprising a haptic actuator.
Figure 4A:
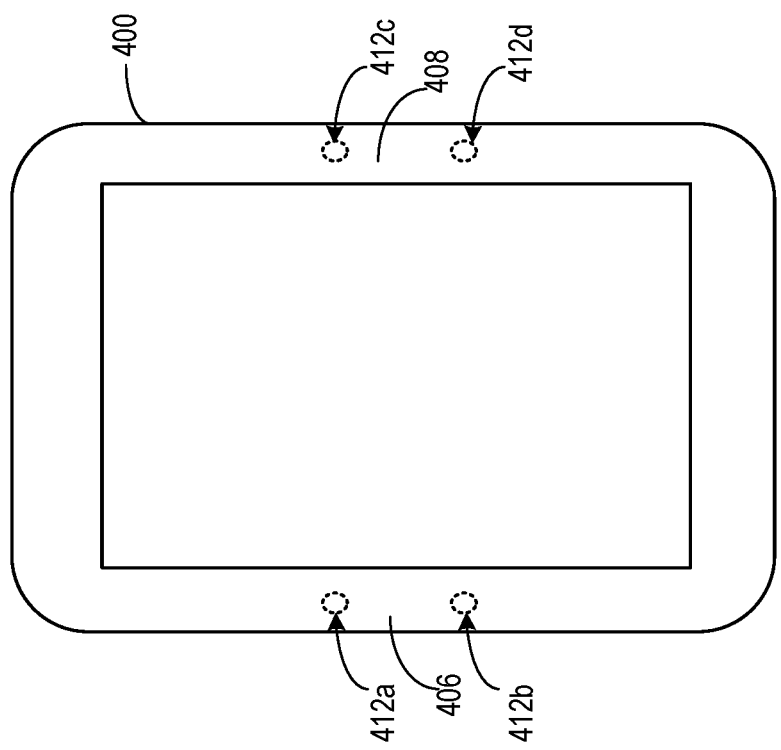

While described above in the context of virtual and augmented reality experiences, a haptic actuating system as described herein may be implemented in numerous other scenarios. FIGS. 4A and 4B illustrate an example article 400 in the form of a tablet computing device. FIG. 4A depicts a front view of the article 400, and FIG. 4B depicts a back view. Various surfaces of the article 400 may be configured to have a soft and pleasing feel. For example, a first side surface 406 and a second side surface 408 of the front of the article 400, as well as a back surface 410 of the article 400, may be at least partially formed from a soft polymer or textile material. Further, a haptic actuator as described herein may be integrated with such soft exterior surface, for example, at locations likely to contact a surface of a user's hand/fingers when the article 400 is held. Examples are shown as haptic actuators 412*a-b* integrated with a right side bezel 406, haptic actuators 412*c-d* integrated with a left side bezel 408, and a plurality of haptic actuators (one of which is shown at 412*e*) integrated with a back surface 410 of the article 400. In another example, article 400 may take the form of a removable case for a device, such that the haptic actuators are integrated into the removable case. In such an example, the case may communicate with an electronic device contained within the case via wired or wireless connection.

Figure 5:
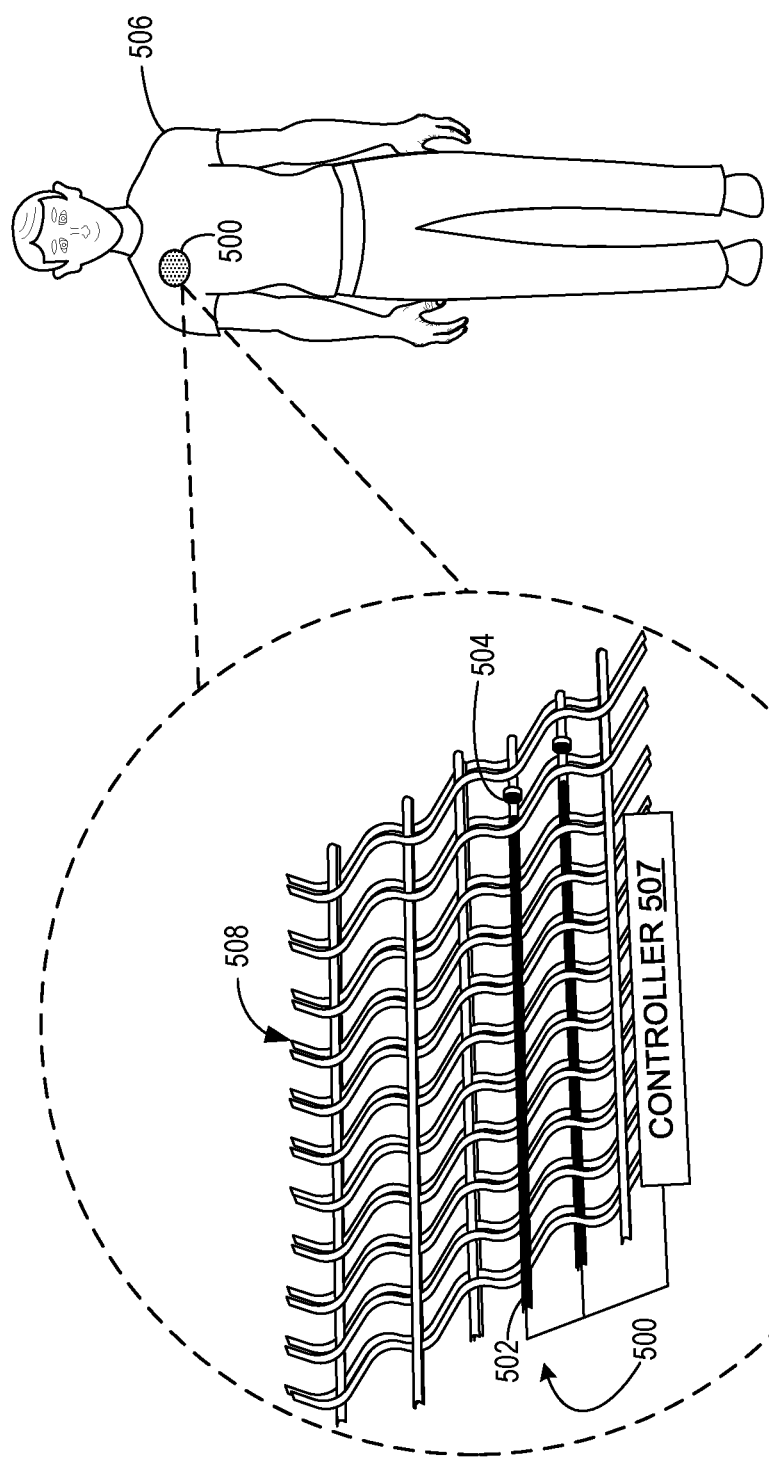
FIG. 5 shows an example wearable device comprising a haptic actuator.

FIG. 5 depicts aspects of another example electromagnetic haptic actuator 500 configured for use with soft touch articles. In the example of FIG. 5, the haptic actuator 500 comprises an electromagnetic yarn 502 that may be controlled to actuate a magnetic object 504. While depicted in this example as integrated into a shirt 506, the electromagnetic haptic actuator 500 may be integrated with any other suitable textile-based electronic article. Examples include clothing, other wearable devices (e.g., an arm or leg sleeve), and upholstery for furniture, automobiles, etc.

When an electric current is applied to the electromagnetic yarn 502 via controller 507, the electromagnetic yarn 502 generates a magnetic field, and generated magnetic flux interacts with the magnetic object 504 to move the magnetic object 504. Multiple such electromagnetic yarns may be embedded within a textile 508, as shown in FIG. 5, or integrated with a textile patch that is applied to a textile article such as shirt 506 via an adhesive, embroidery, etc.

In the depicted example, the textile 508 comprises a woven structure of weft and warp yarns, and the electromagnetic yarn 502 is inserted into the woven structure in the weft direction. In other examples, the electromagnetic yarn may be woven in a warp direction, or embedded within a knit textile as part of a knitting process, e.g. using a flatbed knitting machine. In yet other examples, the electromagnetic yarn may be sewn into or embroidered onto a textile (e.g., as a patch and/or pattern of electromagnetic yarn). In any of these examples, the electromagnetic haptic actuator 500 may be seamlessly integrated with a textile 508 and configured to flex and/or stretch according to movement of the textile 508.

In the depicted example, the magnetic object 504 comprises a disc-shaped permanent magnet positioned substantially transverse to a direction of magnetic flux lines from the electromagnetic yarn 502. In other examples, the magnetic object 504 may take any other suitable form, such as a segment of magnetic yarn (e.g., yarn formed at least partially from a ferromagnetic material). In yet other examples, the magnetic object 504 may comprise another electromagnet configured to be driven with a different magnetic signal than the electromagnetic yarn 502, for example, to attract or repel the electromagnetic yarn 502. The magnetic object 504 may be integrated with the textile 508 in any suitable manner. In some examples the magnetic object 504 may be incorporated into the textile at or near an end of an electromagnetic yarn weft insert 502, for example, by adhering or sewing a structure containing the magnetic object to the textile 508. Where the magnetic object 504 is another electromagnetic yarn segment, the magnetic object 504 may be incorporated into the textile by weaving, knitting or embroidery, as examples.

Figure 6:
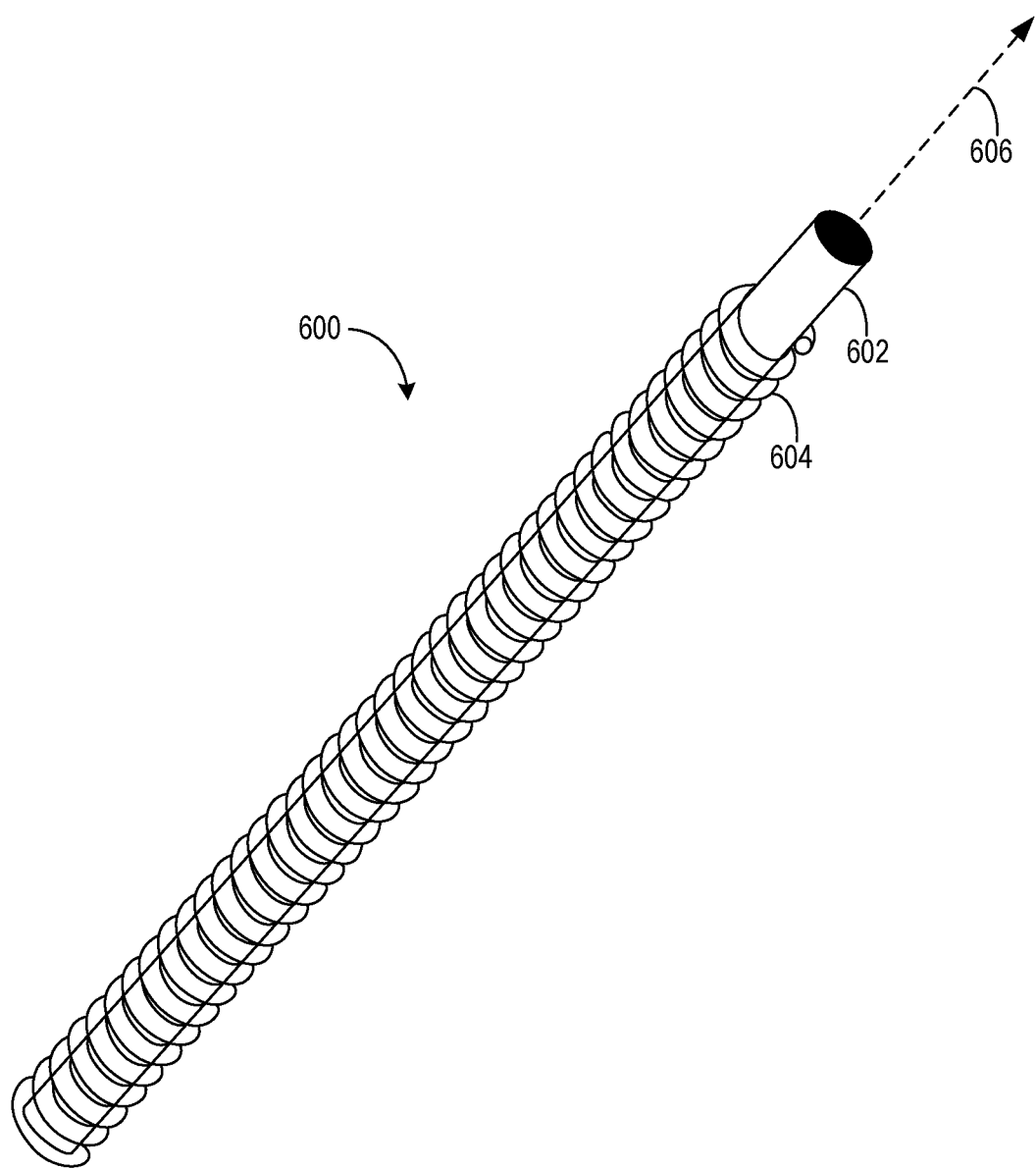
FIG. 6 shows an example inductive coil in the form of a yarn.

FIG. 6 shows aspects of an inductive coil in the form of a yarn 600 suitable for use as electromagnetic yarn 502. The yarn 600 comprises a core 602 and a conductor 604 wound around the core 602. The core 602 may comprise any suitable material. In some examples, the core 602 comprises an electrical insulator, such as a natural and/or synthetic yarn. In other examples, the core 602 comprises a magnetic material, such as a ferromagnetic material. The conductor 604 comprises any suitable electrically conductive material, such as a copper wire. Supplying electrical current to the yarn 600 generates a magnetic field along an axis of the core 602. An example magnetic field line for the yarn 600 is shown at 606. The strength of the magnetic field generated by the yarn 600 depends at least upon a geometry of the yarn (e.g., a gauge of wire used for the conductor 604, height of the yarn 600, number of turns of the wire, etc.), electrical current supplied through the yarn 600, and a material of the core 602. For example, a ferrite core may produce more concentrated magnetic field lines than a polymer core.

The yarn 600 may be formed in any suitable manner. In some examples, traditional core-spun yarn manufacturing techniques may be used to create an inductive coil structure. In other examples, the yarn 600 may be formed via a printing process in which an electrically conductive material is printed on a core material while rotating the core material to form a coiled pattern.

Figure 7:
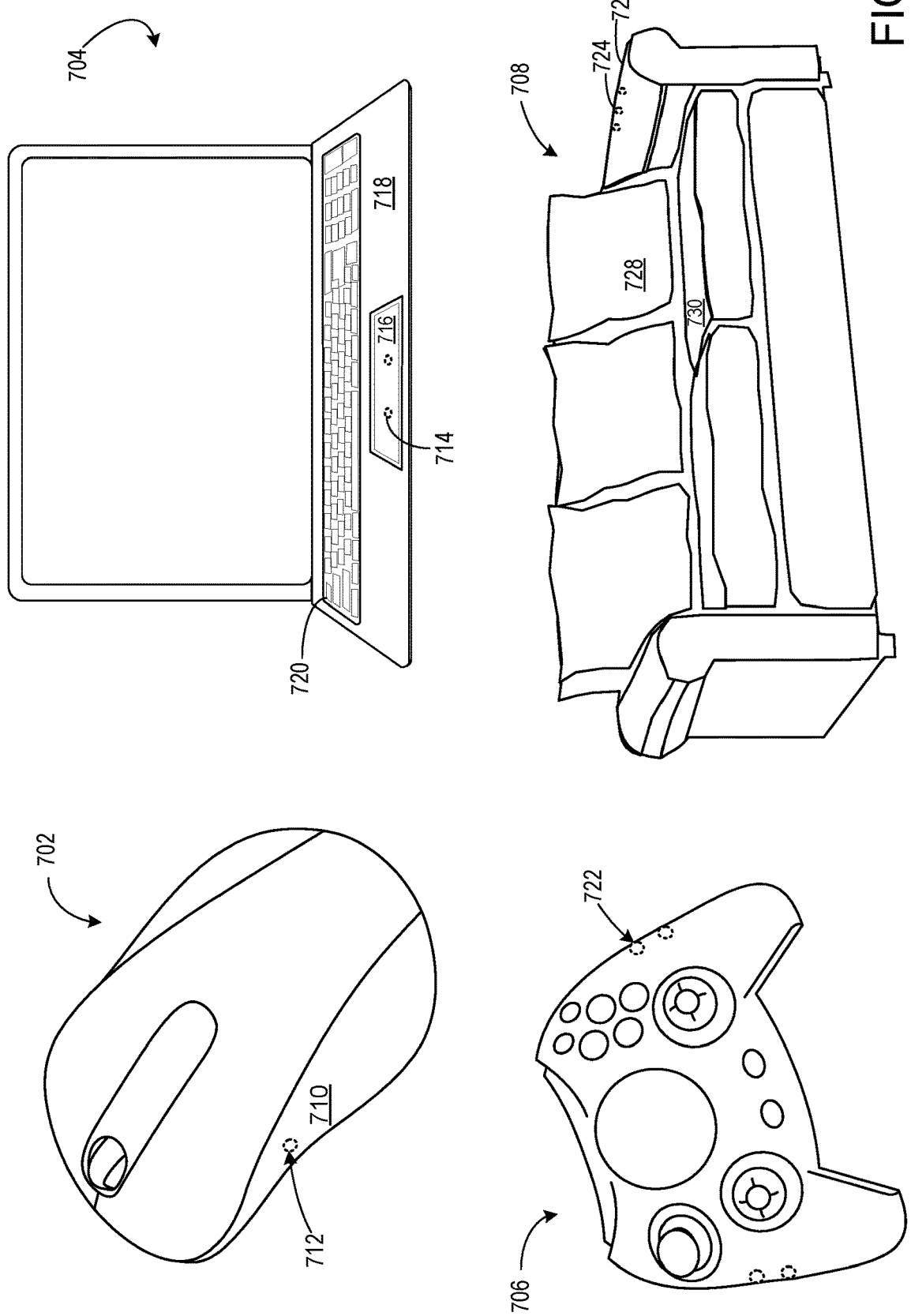
FIG. 7 shows example articles which may incorporate a haptic actuator.

FIG. 7 shows other example articles/electronic devices in which the above-described example haptic actuators may be incorporated. More particularly, FIG. 7 shows a mouse 702, a laptop computing device 704, a gaming console controller 706, and a sofa 708. A mouse 702 may include a surface 710 formed at least partially from a soft, pliable, and/or deformable material (e.g. a textile or soft polymer), and an electromagnetic haptic actuator 712 disposed beneath or embedded with the surface 710 at a location likely to be contacted during use. A laptop 704 may comprise an electromagnetic haptic actuator 714 disposed beneath or embedded within a surface of a touchpad 716, and/or at other locations, such as beneath a palm rest 718 or keyboard key 720. A video game controller 706 may include an electromagnetic haptic actuator 722 disposed beneath or embedded within a portion of a body likely to be contacted by a user's hand when held. A sofa 708 may include an electromagnetic haptic actuator 724 integrated with a surface of an arm rest 726, a back cushion 728, and/or a seat cushion 730. Such electromagnetic haptic actuators may be actuated in response to any suitable event, for example, to alert a user to a notification (a phone call or message) or as part of an immersive gaming experience. The disclosed examples also may be used in vehicle upholstery, bicycle seats, and in soft robotics applications.

As an example of a soft robotics application, an actuator as disclosed herein may be positioned opposite a surface to form a gripping device. An object can be placed between the actuator and the opposing surface, and then a signal may be applied to the actuator to cause the magnet to move farther from the coil, thereby gripping the object. Plural actuators, potentially positioned at different angles to the object, may be used in such an example for additional grip control. Further, the actuators may be covered with a desired soft material to provide a gentle interface for gripping possibly fragile objects. This may help, for example, to gently harvest, inspect, sort, and/or package agricultural products (e.g. produce, eggs, etc.). Such a gripping device may be used in conjunction with a convey belt or other rapid moving platform system, in some instances. Likewise, such a gripping device may be used as a soft robotics interface to move fragile objects within manufacturing and/or distribution environments.

As another example of a soft robotics application, an actuator as disclosed herein may be integrated with a surface of a soft exoskeleton to form a system akin to human musculature. A signal may be applied to the actuator to cause the magnet to move closer to or farther from the inductive coil, and thereby contract or expand the soft exoskeleton. This may used, for example, as a rehabilitation tool to aid an individual in movement. Further, such actuators also may be used in in prosthetic devices, for example, to provide for the ability to gently grip objects.

As yet another example soft robotics application, an actuator as disclosed herein may be integrated with a personal robot, for example, to provide care for an elderly individual(s) as an alternative or a supplement to human caretakers. Soft actuation surfaces of a personal robot may be configured to mimic human touch and/or grip, for example, to perform various caretaking tasks. As yet another example soft robotics application, an actuator as disclosed herein may be used to provide soft actuation capabilities in autonomous robots. For example, robots deployed to detect threats, move explosives, etc., may delicately interact with a dangerous or otherwise volatile object via soft actuated membrane materials.

In some embodiments, the methods and processes described herein may be tied to a computing system of one or more computing devices. In particular, such methods and processes may be implemented as a computer-application program or service, an application-programming interface (API), a library, and/or other computer-program product.

Figure 9:
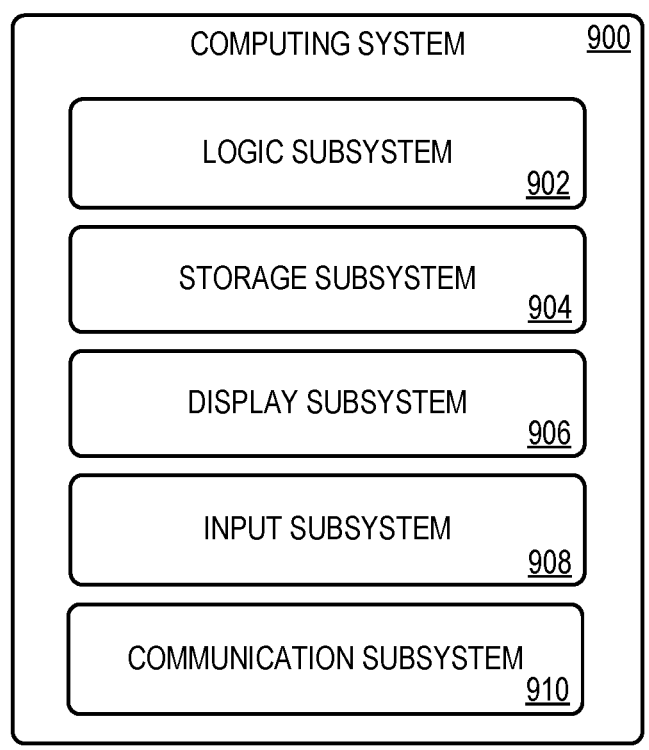
FIG. 9 shows a block diagram illustrating an example computing system.

FIG. 9 schematically shows a non-limiting embodiment of a computing system 900 that can enact one or more of the methods and processes described above. Computing system 900 is shown in simplified form. Computing system 900 may take the form of one or more personal computers, server computers, tablet computers, home-entertainment computers, network computing devices, gaming devices, mobile computing devices, mobile communication devices (e.g., smart phone), and/or other computing devices. Examples include, but are not limited to, the example computing devices and wearable devices described above.

Computing system 900 includes a logic machine 902 and a storage machine 904. Computing system 900 may optionally include a display subsystem 906, input subsystem 908, communication subsystem 910, and/or other components not shown in FIG. 9.

Logic machine 902 includes one or more physical devices configured to execute instructions. For example, the logic machine 902 may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine 902 may include one or more processors configured to execute software instructions. Additionally or alternatively, the logic machine 902 may include one or more hardware or firmware logic machines configured to execute hardware or firmware instructions. Processors of the logic machine 902 may be single-core or multi-core, and the instructions executed thereon may be configured for sequential, parallel, and/or distributed processing. Individual components of the logic machine 902 optionally may be distributed among two or more separate devices, which may be remotely located and/or configured for coordinated processing. Aspects of the logic machine 902 may be virtualized and executed by remotely accessible, networked computing devices configured in a cloud-computing configuration.

Storage machine 904 includes one or more physical devices configured to hold instructions executable by the logic machine 902 to implement the methods and processes described herein. When such methods and processes are implemented, the state of storage machine 904 may be transformed—e.g., to hold different data.

Storage machine 904 may include removable and/or built-in devices. Storage machine 904 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage machine 904 may include volatile, nonvolatile, dynamic, static, read/write, read-only, random-access, sequential-access, location-addressable, file-addressable, and/or content-addressable devices.

It will be appreciated that storage machine 904 includes one or more physical devices. However, aspects of the instructions described herein alternatively may be propagated by a communication medium (e.g., an electromagnetic signal, an optical signal, etc.) that is not held by a physical device for a finite duration.

Aspects of logic machine 902 and storage machine 904 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The term "program" may be used to describe an aspect of computing system 900 implemented to perform a particular function. In some cases, a program may be instantiated via logic machine 902 executing instructions held by storage machine 904. It will be understood that different programs may be instantiated from the same application, service, code block, object, library, routine, API, function, etc. Likewise, the same program may be instantiated by different applications, services, code blocks, objects, routines, APIs, functions, etc. The term "program" may encompass individual or groups of executable files, data files, libraries, drivers, scripts, database records, etc.

It will be appreciated that a "service", as used herein, is an application program executable across multiple user sessions. A service may be available to one or more system components, programs, and/or other services. In some implementations, a service may run on one or more server-computing devices.

When included, display subsystem 906 may be used to present a visual representation of data held by storage machine 904. This visual representation may take the form of a graphical user interface (GUI). As the herein described methods and processes change the data held by the storage machine 904, and thus transform the state of the storage machine 904, the state of display subsystem 906 may likewise be transformed to visually represent changes in the underlying data. Display subsystem 906 may include one or more display devices utilizing virtually any type of technology. Such display devices may be combined with logic machine 902 and/or storage machine 904 in a shared enclosure, or such display devices may be peripheral display devices.

When included, input subsystem 908 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 910 may be configured to communicatively couple computing system 900 with one or more other computing devices. Communication subsystem 910 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem 910 may allow computing system 900 to send and/or receive messages to and/or from other devices via a network such as the Internet.

Another example provides a haptic actuator comprising an inductive coil, a layer of a compressible material positioned adjacent to the inductive coil and transverse to an axis of the inductive coil, and a magnet positioned on the layer of compressible material such that the magnet is movable relative to the inductive coil via compression of the layer of the compressible material upon application of a control signal to the inductive coil. In such an example, the layer of the compressible material may additionally or alternatively be a first layer, and the haptic actuator may additionally or alternatively comprise a second layer of a second compressible material disposed on the magnet on an opposite side as the first layer. In such an example, the first compressible material may additionally or alternatively comprise a different material than the second compressible material. In such an example, the compressible material may additionally or alternatively comprise one or more of a foam and/or an elastomeric material. In such an example, the compressible material may additionally or alternatively comprise a textile. In such an example, the inductive coil may additionally or alternatively comprise a magnetic core. In such an example, the magnet may additionally or alternatively comprise a ferromagnetic material or a paramagnetic material. In such an example, the inductive coil may additionally or alternatively comprise an unshielded power inductor.

Another example provides an article comprising a textile formed at least partially from a yarn that includes a core and a conductor arranged around the core to form an inductive coil, and a magnetic object integrated with the textile at a position transverse to a direction of a magnetic field formed by the inductive coil. In such an example, the magnetic object may additionally or alternatively comprise one or more permanently magnetized yarns integrated with the textile via one or more of weaving, knitting, and/or embroidery. In such an example, the magnetic object may additionally or alternatively be integrated with the textile via one or more of an adhesive and embroidery. In such an example, the textile may additionally or alternatively comprise a woven structure, and the yarn which forms the inductive coil may additionally or alternatively be incorporated by weaving in a weft direction of the textile. In such an example, the yarn which forms the inductive coil may additionally or alternatively be integrated with the textile via embroidery. In such an example, the core may additionally or alternatively comprise a ferromagnetic material. In such an example, the core may additionally or alternatively comprise an electrically insulating material. In such an example, the article may additionally or alternatively comprise one or more of a mouse, a keyboard, a case for a mobile device, a handheld controller, and/or an upholstered item. In such an example, the article may additionally or alternatively comprise a controller configured to send a control signal through the yarn to control the magnetic field.

Another example provides an electronic device comprising a layer comprising one or more of a textile and/or a pliable polymer material, a haptic actuator disposed beneath the layer, the haptic actuator comprising an inductive coil, a compressible structure positioned transverse to an axis of the inductive coil, and a magnet disposed on the compressible structure such that the magnet is movable relative to the inductive coil via compression of the layer of the compressible material upon application of a control signal to the inductive coil, and a controller electrically connected to the inductive coil and configured to control haptic feedback output by the haptic actuator. In such an example, the controller may additionally or alternatively be configured to modify the haptic feedback output by the haptic actuator by varying one or more of a waveform and/or a frequency of the control signal. In such an example, the compressible structure may additionally or alternatively comprise one or more of a foam and/or an elastomeric material.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A haptic actuator, comprising:
   an inductive coil comprising an unshielded power inductor;
   a first layer of a compressible material positioned adjacent to the inductive coil and transverse to an axis of the inductive coil;
   a magnet positioned on a surface of the first layer of compressible material such that the magnet is movable relative to the inductive coil via compression of the first layer of the compressible material upon application of a control signal to the inductive coil; and
   a second layer of compressible material disposed on the magnet on an opposite side relative to the first layer of compressible material.

2. The haptic actuator of claim 1, wherein the first layer of compressible material comprises a different material than the second layer of compressible material.

3. The haptic actuator of claim 1, wherein the compressible material comprises one or more of a foam and/or an elastomeric material.

4. The haptic actuator of claim 1, wherein the compressible material comprises a textile.

5. The haptic actuator of claim 1, wherein the inductive coil comprises a magnetic core.

6. The haptic actuator of claim 1, wherein the magnet comprises a ferromagnetic material or a paramagnetic material.

7. An electronic device, comprising:
a layer comprising one or more of a textile and/or a pliable polymer material;
a haptic actuator disposed beneath the layer, the haptic actuator comprising
   an inductive coil comprising an unshielded power inductor;
   a first layer of compressible material positioned transverse to an axis of the inductive coil;
   a magnet disposed on a surface of the first layer of compressible material such that the magnet is movable relative to the inductive coil via compression of the first layer of the compressible material upon application of a control signal to the inductive coil; and
   a second layer of compressible material disposed on the magnet on an opposite side relative to the first layer of compressible material; and
a controller electrically connected to the inductive coil and configured to control haptic feedback output by the haptic actuator.

8. The electronic device of claim 7, wherein the controller is configured to modify the haptic feedback output by the haptic actuator by varying one or more of a waveform and/or a frequency of the control signal.

9. The electronic device of claim 7, wherein the compressible material comprises one or more of a foam and/or an elastomeric material.

* * * * *